(12) United States Patent
Schulz-Harder

(10) Patent No.: US 8,056,230 B2
(45) Date of Patent: Nov. 15, 2011

(54) METHOD FOR MANUFACTURING PLATE STACKS, PARTICULARLY COOLERS OR COOLER ELEMENTS CONSISTING OF PLATE STACKS

(75) Inventor: Jürgen Schulz-Harder, Regensburg (DE)

(73) Assignee: Curamik Electronics GmbH, Eschenbach (DE)

(*) Notice: Subject to any disclaimer, the term of this patent is extended or adjusted under 35 U.S.C. 154(b) by 1262 days.

(21) Appl. No.: 10/589,698

(22) PCT Filed: Feb. 2, 2005

(86) PCT No.: PCT/DE2005/000163
§ 371 (c)(1),
(2), (4) Date: Aug. 16, 2006

(87) PCT Pub. No.: WO2005/081371
PCT Pub. Date: Sep. 1, 2005

(65) Prior Publication Data
US 2007/0157469 A1 Jul. 12, 2007

(30) Foreign Application Priority Data
Feb. 20, 2004 (DE) .......................... 10 2004 008 836
Mar. 12, 2004 (DE) .......................... 10 2004 012 232

(51) Int. Cl.
*B21D 53/02* (2006.01)
(52) U.S. Cl. ........... 29/890.039; 29/890.03; 29/890.054; 228/183; 228/199; 228/262.6

(58) Field of Classification Search ............... 29/890.03, 29/890.039, 890.054; 228/183, 199, 233.1, 228/234.1, 235.1, 198, 231, 262.6; 372/36
See application file for complete search history.

(56) References Cited

U.S. PATENT DOCUMENTS

| | | | |
|---|---|---|---|
| 2,726,681 A * | 12/1955 | Gaddis et al. ................ | 138/38 |
| 3,405,323 A * | 10/1968 | Surty et al. ................ | 361/688 |
| 3,904,101 A * | 9/1975 | Beltran et al. ............. | 228/173.2 |
| 5,727,618 A * | 3/1998 | Mundinger et al. ......... | 165/80.4 |
| 5,836,506 A * | 11/1998 | Hunt et al. ................. | 228/172 |
| 6,068,179 A * | 5/2000 | Fowler ...................... | 228/157 |
| 6,643,302 B1 | 11/2003 | Nishikawa et al. | |
| 6,737,017 B2 * | 5/2004 | Woodfield et al. .......... | 419/30 |
| 7,299,967 B2 * | 11/2007 | Schulz-Harder ............ | 228/183 |

FOREIGN PATENT DOCUMENTS
EP 1 136 782 9/2001
EP 1 271 723 1/2003

OTHER PUBLICATIONS
Human Translation of PCT Search Report; PCT/ DE2005/000163; Aug. 16, 2006.*

* cited by examiner

*Primary Examiner* — David Bryant
*Assistant Examiner* — Ryan J Walters
(74) *Attorney, Agent, or Firm* — Welsh Flaxman & Gitler LLC

(57) ABSTRACT

A method for manufacturing plate stacks for the production of coolers, cooler elements or heat sinks made of at least one plate stack for cooling electric or opto-electric components. The process includes the manufacture of plates or boards of metal, stacking the plates to form a plate stack, joining of the plates with the application of heat and pressure to form a stack, and post-treatment of the plate stack.

11 Claims, 4 Drawing Sheets

METHOD FOR MANUFACTURING PLATE STACKS, PARTICULARLY COOLERS OR COOLER ELEMENTS CONSISTING OF PLATE STACKS

BACKGROUND OF THE INVENTION

The invention relates to a method for manufacturing plate stacks, particularly for manufacturing coolers or cooler elements or heat sinks consisting of at least one plate stack according.

Heat sinks or coolers, also known as micro-coolers, are known in the art and are designed especially for cooling electrical components or modules, particularly also high-power components or modules, consisting of thin metal (metal foil) plates joined with each other to form a stack, the inner plates of the stack being structured, i.e. provided with openings or passages, so as to form cooling channels or flow paths for a coolant in the interior of the plate stack or cooler. For surface joining of the plates, they are provided with a joining material on their joining surfaces, i.e. on their surface sides. In order to join or connect the plates, the latter are then stacked one on top of the other in a stack and then heated to a suitable process temperature, in which a fusible metal area (joining or hot-melt layer) is produced on the joining surfaces using the joining material, so that after cooling of the stacks they are joined with each other to form the plate stack.

The disadvantage of such methods is that especially at the junction between two plates of the plate stack, micro cavities remain, which promote corrosion and can therefore cause leaks in coolers, heat pipes, etc.

It is an object of the invention is to demonstrate a method that eliminates this disadvantage.

SUMMARY OF THE INVENTION

The invention relates to a method for manufacturing plate stacks, for the production of coolers, cooler elements or heat sinks comprising at least one plate stack for cooling electric and/or opto-electric components, wherein the method comprises at least the following process steps: manufacture of plates or boards of metal, stacking of the plates to form a plate stack, joining of the plates with the application of heat at a mechanic pressing force between 20 and 2500 bar and at a joining temperature (IF) and at an atmospheric pressure or in a vacuum, cooling of the plate stack formed by the joined plates to a temperature below the joining temperature (IF) and post-treatment (HIP treatment) of the plates stack in an inert gas atmosphere at an inert gas pressure (PB) between 200 and 2000 bar, and at a post-treatment temperature (TB) that is below the joining temperature (IF).

BRIEF DESCRIPTION OF THE DRAWINGS

The invention is explained below based on exemplary embodiments with reference to the appended drawings, wherein.

DETAILED DESCRIPTION OF THE INVENTION

Figure 1:
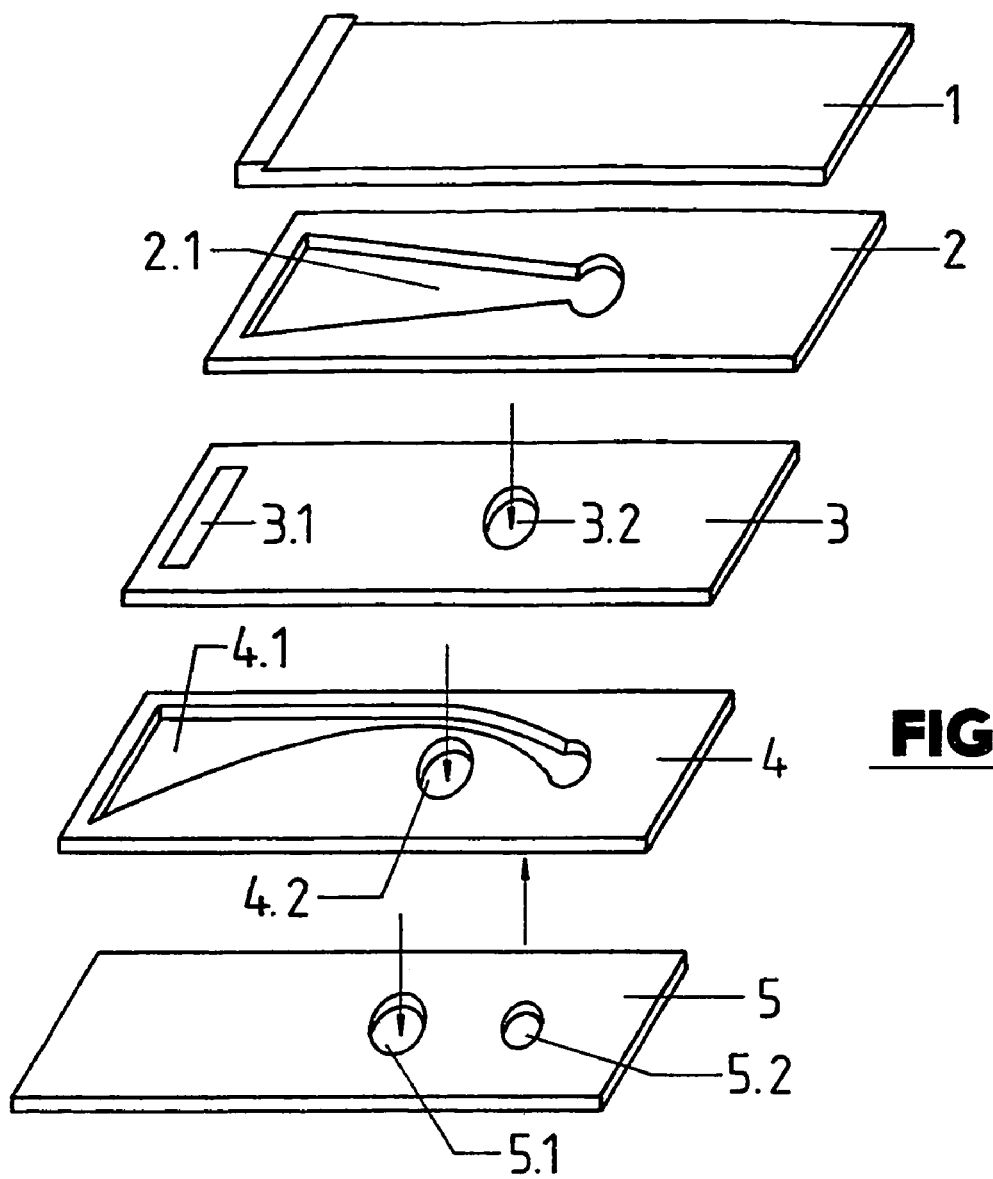
FIG. 1 shows a simplified exploded perspective view of five metal plates or layers of a cooler for cooling electric components, in particular for cooling laser diodes or laser diode bars.

In the drawings, 1-5 designate plate-shaped elements or plates made of metal, for example of copper, which are joined with each other on the surface to form a stack, forming a cooler or heat sink 6 for cooling an electric component, for example a laser diode bar, comprising a plurality of laser emitting diodes. The plates 1-5 in the depicted embodiment are rectangular blanks of the same size from a metal foil, for example from a copper foil.

In order to form a cooler structure and to form channels for the supply and removal of a coolant, e.g. a liquid coolant, the plates 2-5 are structured, i.e. provided with corresponding passages or openings 2.1, 3.1, 3.2, 4.1, 4.2 and 5.1, 5.2.

Using a suitable joining material, which is generally designated 7 in the drawings, and using a joining process adapted to said joining material, the plates, which are arranged in a stack, are joined with each other on their facing surfaces by applying heat at a joining temperature, so that the openings 5.1 and 5.2 form the connections for the supply and removal of the coolant and the remaining openings 2.1, 3.1, 3.2 form an internal, outwardly sealed flow channel for the coolant. Structuring of the plates 1-5 takes place by means of a suitable method, for example by etching or stamping, before joining of the plates.

Suitable joining methods for joining the plates 1-5 include all known methods used for joining metal plates and in particular also for the manufacture of coolers or heat sinks made of plate stacks. Individual methods for this purpose are described in more detail below. These methods are generally such methods in which the joining or connecting of the plates 1-5 takes place at an elevated temperature (e.g. higher than 650° C.), by means of a brazed joint in the broadest sense, i.e. by melting on a metallic connecting layer or the joining material 7 and subsequent cooling, or also by diffusion welding.

The disadvantage of such known methods includes the fact that recesses or hollow spaces, i.e. so-called micro cavities, are formed in the area where two adjoining plates 1-5 are joined, some of which are open toward the flow channels formed by the openings or passages. The particular disadvantage of such micro cavities 8 is that they cause increased corrosion and especially that corrosion from a plurality of such micro cavities 8 can cause holes in the respective cooler 6 in the area where two plates 1-5 are joined, thus causing the flow channel formed in the cooler to leak.

Figure 3:
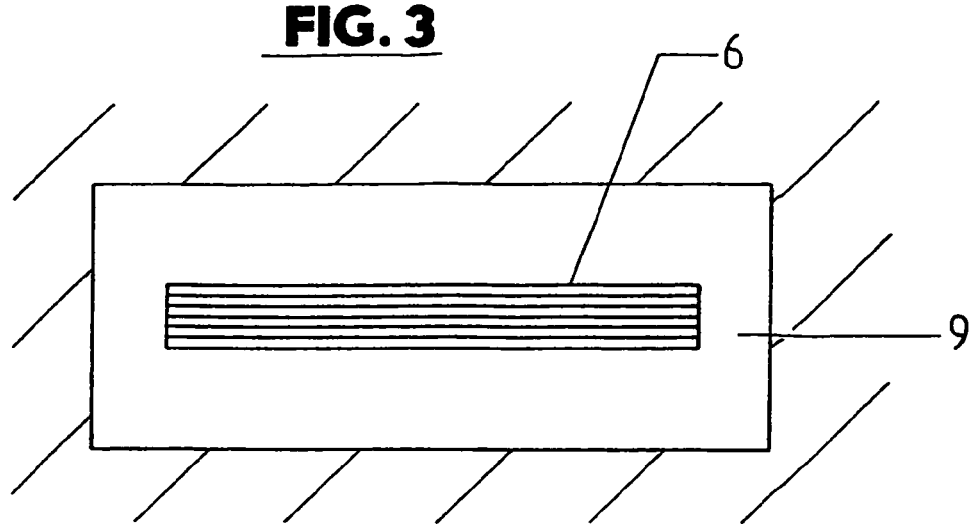
FIG. 3 shows a simplified schematic representation of a chamber housing the heat sink after joining of the plates for post-treatment through hot isostatic pressing (HIP).

To prevent this according to the invention, the cooler 6, after being manufactured, i.e. after joining of the plates 1-5, is post-treated in a chamber 9 (FIG. 3), namely in an inert gas atmosphere at a high treatment temperature TB below the joining temperature TF and at a high gas pressure PB between 200 and 2000 bar, preferably at a gas pressure of at least 1000 bar during this post-treatment process. As a result of this post-treatment, also known as hot isostatic pressing (HIP), the existing micro cavities 8 are pressed together and the plates 1-5 are subsequently joined by diffusion welding in the area of the micro cavities 8 existing up until that time, so that after completion of the post-treatment or HIP treatment the connection between the plates 1-5 is essentially free of micro cavities, thus preventing the corrosion problems mentioned above.

A suitable inert gas is nitrogen, argon or other inert gases or rare gases or mixtures of the same, in which the oxygen content in the inert gas atmosphere is adapted to the temperature TB of the post-treatment process and to the metal used for the plates 1-5 so that no or no appreciable oxidation of the metal of the plates 1-5 occurs.

In a preferable embodiment the oxygen content of the inert gas atmosphere is no more than approximately 300% of the equilibrium oxygen partial pressure of the metal used at the respective treatment temperature TB. The use of copper plates results in an oxygen content and oxygen partial pressure based on the temperature according to the following table:

| Treatment temperature TB (degrees C.) | Oxygen partial pressure (bar) |
|---|---|
| 1,085 | $1.2 \times 10^{-5}$ |
| 1,027 | $3.3 \times 10^{-6}$ |
| 927 | $2.43 \times 10^{-7}$ |
| 827 | $3.9 \times 10^{-8}$ |
| 727 | $1.0 \times 10^{-9}$ |
| 627 | $1.1 \times 10^{-11}$ |
| 527 | $4.1 \times 10^{-13}$ |
| 427 | $2.8 \times 10^{-16}$ |
| 327 | $1.7 \times 10^{-20}$ |

Therefore, it is necessary during the post-treatment process to prevent oxidation or other reactions of the material of the cooler with the pressurized gas. In systems in which copper, copper in combination with oxygen, silver or gold is used as the material for the plates 1-5 or for the joining material 7, nitrogen is suitable for use as the pressurized gas or inert gas. In other systems, in which for example iron and/or aluminum is used, nitrogen is not suitable as a pressurized gas due to the formation of nitrides. Argon is then used as the inert gas. Like nitrogen or argon, other technical gases that can be used as pressurized gases also contain small amounts of oxygen. In order to prevent oxidation or other reactions with the cooler 6 during post-treatment, the values specified in the table ensure that the oxygen content is not excessively above the equilibrium oxygen partial pressure of the metal-oxygen system. However, an oxygen content that exceeds the equilibrium oxygen partial pressure by 200-300% is still permissible, since in particular at a not excessively high post-treatment temperature TB, the reaction of the metal used for the cooler 6 with oxygen, i.e. the oxidation, is genetically inhibited and besides, a slight oxide layer is generally not a hindrance. In furnaces with graphite, this problem does not exist in any case.

The treatment temperature TB is set so that the joint between the plates 1-5 is retained during post-treatment, i.e. the treatment temperature TB is as high as possible in order to achieve the above-mentioned diffusion welding for removing the micro cavities 8, but is below the temperature TF at which, after joining, the entire joining material 7, i.e. the entire metallic system forming the joining material 7 between the plates 1-5 during joining of said plates and therefore all components of this system have become solid, i.e. the solidus temperature of the joining material system. In a preferred embodiment of the invention the treatment temperature TB is between 50 and 99% of the temperature TF in °K.

For post-treatment of the cooler 6, after joining and cooling to a temperature that allows comfortable handling of the cooler 6, said cooler is placed in the chamber 9 and is then re-heated in said chamber to the treatment temperature TB and kept in the chamber 9 at the post-treatment pressure PB for a post-treatment period, for example between 15 and 45 minutes.

However, it is also generally possible, with a corresponding design of the facilities used for production, to conduct the post-treatment immediately after joining, as soon as the temperature of the manufactured cooler 6 has reached the treatment temperature TB.

Figure 4:
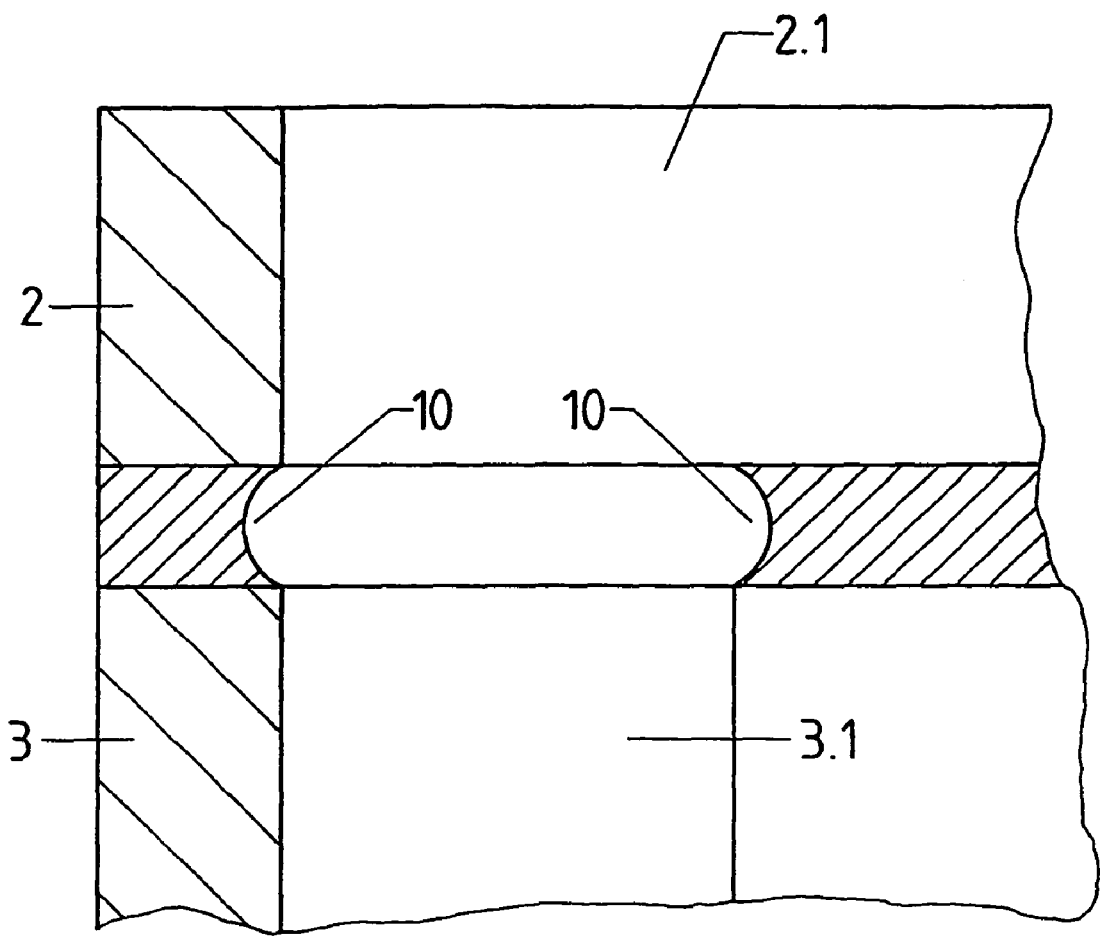

As described above, various joining methods or techniques and joining materials 7 suitable for these methods are conceivable. For example, it is possible, prior to joining, to apply the joining material only to the surface sides of the individual plates 1-5, namely only to their surface sides to be joined. The disadvantage of this, according to FIG. 4, is that dead spaces 10 are formed in the junction areas between two plates in the proximity of the joining material 7, as depicted in an enlarged view in FIG. 4 in the junction area between the plates 2 and 3 and in the area of the openings 2.1 and 3.1 there. These dead spaces 10 are associated with considerable disadvantages, e.g. they cause unwanted turbulence of the coolant flowing through the cooler 6, and in particular such dead spaces 10 cause undesirable corrosion, especially on the edges of the openings 2.1 and 2.1 exposed through the dead spaces 10.

Figure 6:
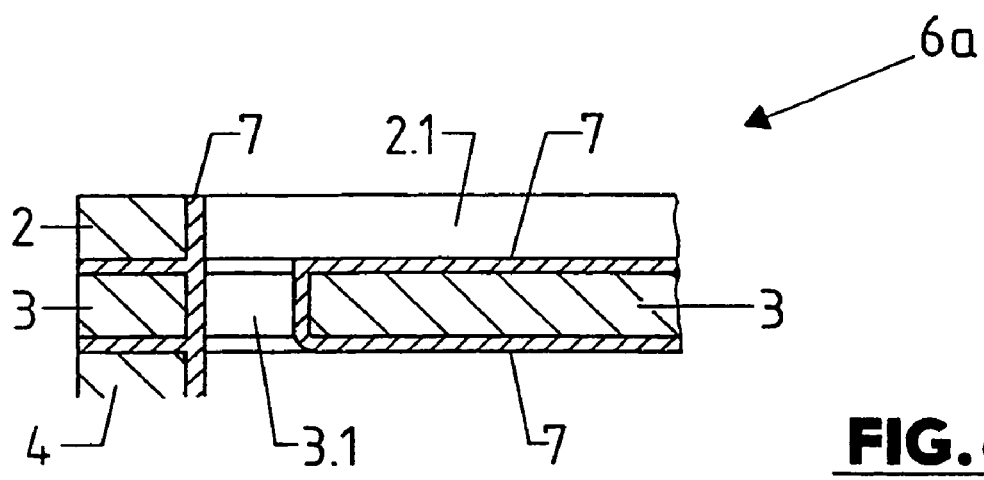
FIGS. 4-6 show partial sections of the metal plates or layers of a cooler.
Figure 2:
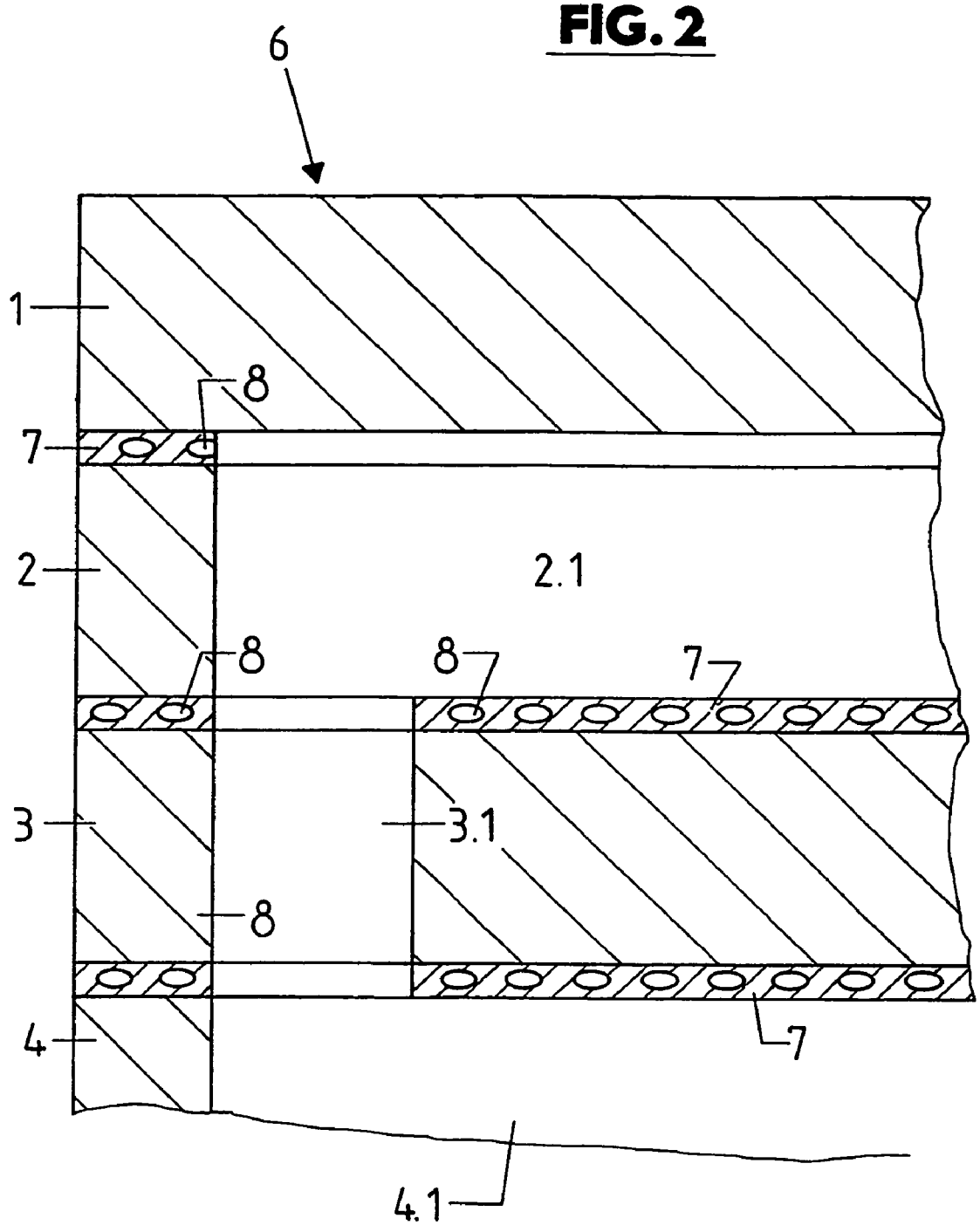
FIG. 2 shows a simplified representation of a cross section through the heat sink manufactured from the plates of FIG. 1.
Figure 5:
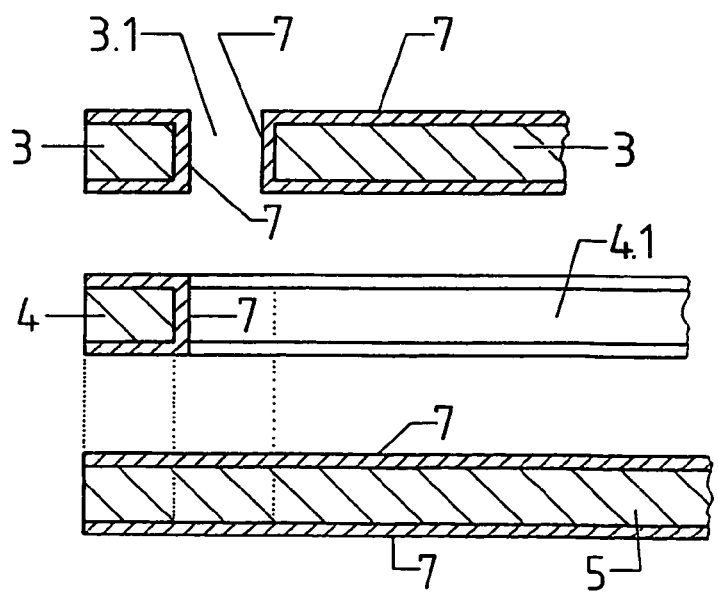

To prevent the dead spaces 10, it may therefore be at least advantageous, as depicted in FIG. 5, to provide the plates 1-5 with the joining material 7 not only on their surface sides, but also on the contact surfaces of the openings, so that after joining of the plates 1-5 all surfaces and edges, in particular also the surfaces and edges of the channels of the cooler 6 formed by the side surfaces of the openings are covered by the joining material 7, as depicted in FIG. 6 for the cooler 6a. This prevents the disadvantageous dead spaces 10. The post-treatment or hot isostatic pressing (HIP) prevents any micro cavities 8 also in the joining material covering the channels of the cooler 6a.

It was assumed above that for the manufacture of the cooler 6a all plates 1-5 are provided with the joining material 7 on their surface sides to be joined with each other and also on the inner surfaces of the openings. Generally it is also sufficient to coat only some of the inner surfaces of the openings of the plates 1-5 with the joining material 7 before joining.

The joining of the plates 1-5 made of copper, for example, takes place for example by means of direct copper bonding (DCB), in which copper oxide is used as the joining material, forming in combination with the adjoining copper of the plates 1-5 a eutectic or eutectic joining or melt layer with a melting point between 1065° C. and 1082° C. Accordingly, the maximum treatment temperature is $TB_{max}$=[0.99(1065+273)−273]° C.=1052° C. The minimum treatment temperature is then $TB_{min}$=[0.5(1065+273)−273]° C.=396° C.

Use of a brazing metal, e.g. a copper-silver alloy, as the joining material 7, with a eutectic temperature or joining temperature of approximately 768° C., results in the following treatment temperatures:

$TB_{max}$=[0.99(768+273)−273]° C.=746° C.

$TB_{min}$=[0.50(768+273)−273]° C.=377° C.

Use of a brazing metal in the form of an alloy of copper and gold as the joining material 7, with a eutectic temperature or joining temperature of approximately 889° C., results in the following treatment temperatures:

$TB_{max}$=[0.99(889+273)−273]° C.=877.5° C.

$TB_{min}$=[0.50(889+273)−273]° C.=308° C.

Based on the respective amount of joining material 7 or brazing metal used and based on the process temperature and/or process time applied during the joining process, alloys can form at the junctions between the plates, metallically connecting them with each other, with a joining temperature TF that is higher than the original eutectic temperature of the joining material, so that the temperature TB can also be set accordingly higher.

The invention is described below based on several examples.

EXAMPLE 1

In this example, copper-oxide is used as the joining material. To manufacture the cooler 6 or 6a, the plates 1-5 are manufactured with the passages and openings by etching or stamping. Afterwards, the plates are provided, by means of oxidation, with joining material 7 on their surface sides and also on the inner surfaces of the openings.

The plates 1-5 are then stacked and the stack is heated to the required process temperature, for example 1075° C. in an inert gas atmosphere with an oxygen content of 2.5 to 100 ppm.

Afterwards, the stack now consisting of the joined plates 1-5 is cooled to a temperature below the process temperature, e.g. to room temperature. The cooler 6 or 6a thus manufactured can be heated in the chamber 9 at an inert gas pressure of approximately 1000 bar to a temperature of approximately 1020° C. and kept at this pressure and this temperature for a period of 30 minutes. It is then allowed to cool to room temperature.

EXAMPLE 2

In this example silver is used as the joining material, forming at the joining temperature together with the adjoining copper of the plates 1-5 a eutectic brazing metal made of silver and copper.

The plates 1-5 are again manufactured with their openings by stamping and etching. Afterwards, a silver layer, for example with a thickness of 3 μm, is applied galvanically and/or chemically to the plates 1-5 and at least to the surface sides of these plates to be joined, but preferably also at least on some of the plates, to the contact surfaces of the openings.

The plates 1-5 thus treated are then stacked and the plate stack is heated in an inert gas atmosphere, for example in a nitrogen atmosphere with an oxygen content of less than 100 ppm and at a process or joining temperature TF of 850° C. Afterwards, the plate stack or the cooler manufactured as a plate stack is allowed to cool to room temperature.

The plate stack is then placed in the chamber 9 where it is heated in an inert gas atmosphere, for example in a nitrogen atmosphere at a post-treatment pressure PB of approximately 1200 bar, to a post-treatment temperature TB of 650° C. and kept at this pressure and post-treatment temperature TB for a period of about 45 minutes, after which it is allowed to cool to room temperature.

EXAMPLE 3

In this example gold is used as the joining material, forming together with the copper of the plates 1-5 a eutectic brazing metal. The plates 1-5 are again manufactured with their openings, followed by the application of a gold layer with a thickness of approximately 2 μm to the plates 1-5 and to the contact surfaces of at least some recesses or passages.

The stacked plates are then heated to 1030° C. in an inert gas atmosphere formed for example from nitrogen with an oxygen content of less than 100 ppm. Afterwards, the plate stack or cooler 6 or 6a is cooled and placed in the chamber 9 where it is post-treated in an inert gas atmosphere formed by argon at a pressure of approximately 900 bar and a temperature TB of approximately 920° C., for a duration of about 30 minutes, after which it is to cool to room temperature.

The invention was described above based on exemplary embodiments. It goes without saying that various modifications and variations are possible without abandoning the underlying inventive idea upon which the invention is based.

REFERENCE LIST

1-5 plate
6-6a cooler
7 joining material
8 micro cavities
9 chamber
10 deadspace
2.1, 3.1, 3.2, 4.1, 5.1, 5.2 passage or opening

The invention claimed is:

1. A method for manufacturing at least one plate stack, for the production of coolers or cooler elements for cooling electric or opto-electric components, wherein the method comprises the following process steps:
    manufacturing plates of copper,
    stacking of the plates to form the at least one plate stack,
    joining of the plates with an application of heat at a joining temperature (TF) between 1065° C. and 1082° C. and at an atmospheric pressure in a joining or bonding process step by direct copper bonding to form a bonded plate stack,
    cooling of the bonded plate stack to a temperature below the joining temperature (TF); and
    placing of the bonded plate stack into a chamber for a post-treatment; and performing a hot isostatic pressing post-treatment of the bonded plate stack inside the chamber in an inert gas atmosphere at an inert gas pressure (PB) between 200 and 2000 bar, and at a post-treatment temperature (TB) that is below the joining temperature (TF).

2. The method according to claim 1, wherein the post-treatment temperature (TB) is approximately 95 to 99% of the joining temperature (TF).

3. The method according to claim 1, wherein the post-treatment temperature (TB) is at least 50% of the joining temperature (TF).

4. The method according to claim 1, wherein post-treatment of the plate stack in an inert gas atmosphere is conducted at a gas pressure between 200 and 2000 bar, and at a post-treatment temperature (TB) corresponding to approximately 50-99% of the joining temperature (TF) at which all metal components of a system forming a joining connection have solidified.

5. The method according to claim 1, wherein post-treatment of the plate stack is conducted in an inert gas atmosphere at a gas pressure between 200 and 2000 bar, and at a post-treatment temperature (TB) corresponding to approximately 50-99% of the joining temperature (TF) at which all components of a brazing metal forming a joining connection have solidified.

6. The method according to claim 1, wherein during the post-treatment, an inert gas atmosphere formed by argon or nitrogen with a maximum oxygen content is used that amounts to approximately 300% of an oxygen content corresponding to an equilibrium oxygen partial pressure at the post-treatment temperature (TB).

7. The method according to claim 6, wherein the oxygen content in the inert gas atmosphere is less than an oxygen partial pressure of $15 \times 10^{-6}$ bar.

8. The method according to claim 1, further comprising the following process steps:

application or creation of a copper-oxide layer as joining material on the plates, heating of the plates after stacking to a temperature between 1065 and 1082° C., and post-treatment of the plate stack at a pressure between 200 and 2000 bar, and at a post-treatment temperature of at least 390° C. and no more than 1052° C.

9. The method according to claim 1, further comprising the following process steps:

application or creation of a copper-oxide layer as joining material on the plates, and heating of the plates after stacking to a temperature of 1065° C. and post-treatment of the plate stack at a pressure of 1000 bar at a post-treatment temperature of 1020° C.

10. The method according to claim 1, wherein the joining of the plates takes place with the application of heat at a mechanic pressing force between 20 and 2500 bar.

11. The method according to claim 1, wherein a joining material is applied to surfaces of at least some openings.

* * * * *